(12) United States Patent
Arai et al.

(10) Patent No.: US 8,524,378 B2
(45) Date of Patent: Sep. 3, 2013

(54) COPPER FOIL FOR PRINTED CIRCUIT

(75) Inventors: Hideta Arai, Ibaraki (JP); Naoki Higuchi, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 58 days.

(21) Appl. No.: 13/129,848

(22) PCT Filed: Nov. 13, 2009

(86) PCT No.: PCT/JP2009/069345
§ 371 (c)(1),
(2), (4) Date: Jun. 16, 2011

(87) PCT Pub. No.: WO2010/061736
PCT Pub. Date: Jun. 3, 2010

(65) Prior Publication Data
US 2011/0262764 A1    Oct. 27, 2011

(30) Foreign Application Priority Data
Nov. 25, 2008  (JP) .................. 2008-299431

(51) Int. Cl.
*B32B 15/20*  (2006.01)

(52) U.S. Cl.
USPC ........... 428/675; 428/610; 428/618; 428/668; 428/669

(58) Field of Classification Search
USPC ................ 428/675, 607, 548, 610, 618, 668, 428/669
See application file for complete search history.

(56) References Cited

U.S. PATENT DOCUMENTS

| | | | |
|---|---|---|---|
| 5,019,222 A * | 5/1991 | Hino et al. ................ 205/152 |
| 6,638,642 B2 | 10/2003 | Kitano et al. | |
| 6,833,198 B2 * | 12/2004 | Sakamoto et al. ......... 428/596 |
| 6,835,241 B2 | 12/2004 | Tsuchida et al. | |
| 6,939,622 B2 * | 9/2005 | Yoshihara et al. ......... 428/675 |
| 6,960,391 B2 | 11/2005 | Natsume et al. | |
| 7,026,059 B2 | 4/2006 | Suzuki et al. | |
| 7,175,920 B2 | 2/2007 | Suzuki et al. | |
| 7,341,796 B2 * | 3/2008 | Hanafusa ................ 428/674 |
| 7,651,783 B2 * | 1/2010 | Tsuchida et al. .......... 428/626 |
| 2002/0182432 A1 | 12/2002 | Sakamoto et al. | |
| 2005/0158574 A1 | 7/2005 | Suzuki et al. | |
| 2006/0068184 A1 | 3/2006 | Hamada et al. | |
| 2008/0038522 A1 | 2/2008 | Hamada et al. | |
| 2009/0162685 A1 | 6/2009 | Kobayashi et al. | |
| 2009/0208762 A1 | 8/2009 | Akase | |
| 2010/0040873 A1 | 2/2010 | Kohiki et al. | |
| 2010/0212941 A1 | 8/2010 | Higuchi | |
| 2010/0215982 A1 | 8/2010 | Kohiki et al. | |
| 2010/0221563 A1 | 9/2010 | Kohiki et al. | |
| 2010/0279069 A1 | 11/2010 | Hanafusa | |
| 2010/0323215 A1 | 12/2010 | Makino | |
| 2011/0003169 A1 | 1/2011 | Makino et al. | |

FOREIGN PATENT DOCUMENTS

| | | |
|---|---|---|
| GB | 1558919 | 1/1980 |
| JP | 04-096395 A | 3/1992 |
| JP | 09-087889 A | 3/1997 |
| JP | 10-018075 A | 1/1998 |
| JP | 2006-210689 A | 8/2006 |
| JP | 2006-222185 A | 8/2006 |

* cited by examiner

*Primary Examiner* — Cathy Lam
(74) *Attorney, Agent, or Firm* — Howson & Howson LLP

(57) ABSTRACT

Provided is a copper foil for a printed circuit with an electrodeposited ternary-alloy layer composed of copper, cobalt and nickel formed on a surface of the copper foil, wherein the electrodeposited layer comprises dendritic particles grown on the copper foil surface, and the entire surface of the copper foil is covered with particles having an area as seen from above the copper foil surface of 0.1 to 0.5 $\mu m^2$ at a density of 1000 particles/10000 $\mu m^2$ or less, particles exceeding 0.5 $\mu m^2$ at a density of 100 particles/10000 $\mu m^2$ or less, and particles less than 0.1 $\mu m^2$ as the remainder. Roughening particles formed dendritically in a roughening treatment based on copper-cobalt-nickel alloy plating are inhibited from shedding from the copper foil surface, and the phenomenon known as powder falling and uneven treatment are thereby inhibited.

11 Claims, 2 Drawing Sheets

SEM Magnification: x30K

[Product after Remediation of Powder Falling]    [Product based on Conventional Treatment]

Magnification: x30K

COPPER FOIL FOR PRINTED CIRCUIT

BACKGROUND OF THE INVENTION

The present invention relates to a copper foil for a printed circuit, and in particular relates to a copper foil for a printed circuit capable of reducing the powder falling and uneven treatment of a roughened layer obtained by performing copper-cobalt-nickel alloy plating to the surface of a copper foil. The copper foil for a printed circuit of the present invention can be suitably applied, for example, to a fine pattern printed circuit and a FPC (Flexible Printed Circuit) for magnetic head.

BACKGROUND ART

Copper and copper alloy foil (hereinafter collectively referred to as "copper foil") have contributed significantly to the development of the electric/electronic industry and, in particular, are indispensible as a printed circuit material. A copper foil for a printed circuit is generally prepared as follows. In order to produce a copper clad laminate, copper foil is laminated and bonded to a base material such as a synthetic resin board or film with an adhesive, or without using an adhesive under high temperature and pressure. In order to subsequently form the intended circuit, after printing the required circuit via the processes of photoresist application and exposure, etching treatment for eliminating the unwanted parts is performed.

Ultimately, the required element is soldered to form various types of printed circuit boards for electronic devices. The copper foil for a printed circuit board differs in the surface that is bonded to the resin base material (roughened surface) and the surface that is not bonded to the resin base material (glossy surface), and numerous methods have been proposed for both.

For example, main requirements of the roughened surface formed on the copper foil are as follows: (1) no oxidative discoloration during the storage thereof, (2) peel strength with the base material is sufficient even after high-temperature heating, wet processing, soldering, chemical treatment and the like, and (3) no so-called lamination contamination that occurs after the lamination with the base material and etching.

Roughening treatment of the copper foil plays an important role in deciding the adhesiveness between the copper foil and the base material. As the roughening treatment, the copper roughening treatment of electrodepositing copper was initially adopted, but various other technologies have been proposed thereafter, and copper-nickel roughening treatment has become one of the representative treatment methods for improving the thermal peeling strength, hydrochloric acid resistance and oxidation resistance.

The present applicant has proposed the copper-nickel roughening treatment (refer to Patent Document 1), and achieved results. The copper-nickel treated surface takes on a black color and, in particular, with a rolled foil for a flexible substrate, the black color resulting from the copper-nickel treatment is acknowledged as the symbol of the product.

Nevertheless, while the copper-nickel roughening treatment is superior in terms of thermal peeling strength, oxidation resistance and hydrochloric acid resistance, it is difficult to perform etching with an alkali etching solution which is becoming important for fine pattern treatment in recent years, and the treated layer becomes etching residue during the formation of a fine pattern with a circuit width of 150 µm pitch.

Thus, as a fine pattern treatment method, the present applicant has previously developed the Cu—Co treatment (refer to Patent Document 2 and Patent Document 3) and the Cu—Co—Ni treatment (refer to Patent Document 4). These roughening treatments yield favorable etching properties, alkali etching properties and hydrochloric acid resistance, but it was once again discovered that the thermal peeling strength would deteriorate when an acrylic adhesive is used, and the oxidation resistance was also insufficient with the color being brown to umber brown, and not reaching black.

Pursuant to the trend of finer patterns and diversification of printed circuits in recent years, the following are being demanded; namely, 1) to possess thermal peeling strength (particularly upon using an acrylic adhesive) and hydrochloric acid resistance that are comparable to cases of performing Cu—Ni treatment, 2) to be able to etch a printed circuit having a circuit width of 150 µm pitch or less with an alkali etching solution, 3) to improve the oxidation resistance (oxidation resistance in an oven at 180° C.×30 minutes) as in the case of Cu—Ni treatment, and 4) to achieve blackening treatment as in the case of Cu—Ni treatment.

In other words, the thinner the circuit becomes, the tendency of the circuit peeling off due to the hydrochloric acid etching solution will increase, and it is necessary to prevent such peeling of the circuit caused thereby. The thinner the circuit becomes, the tendency of the circuit peeling off due to high temperatures caused by soldering and other treatments will also increase, and it is also necessary to prevent such peeling of the circuit caused thereby. In this day and age where patters are becoming even finer, for instance, it is an essential requirement to be able to etch a printed circuit having a circuit width of 150 µm pitch or less with a $CuCl_2$ etching solution, and alkali etching is also becoming an essential requirement pursuant to the diversification of the resist and the like. A black surface is also becoming important for the manufacture of copper foils and from the perspective of chip mounts in order to improve the positioning accuracy and thermal absorption.

In response to the foregoing demands, the present applicant succeeded in developing a copper foil treatment method in order to obtain a printed circuit copper foil comprising many of the general characteristics described above by performing roughening treatment to the surface of the copper foil by way of copper-cobalt-nickel alloy plating, and thereafter forming a cobalt plated layer or a cobalt-nickel alloy plated layer. In particular, this printed circuit copper foil comprises the various characteristics described above that are comparable to Cu—Ni treatment, the thermal peeling strength does not deteriorate even upon using an acrylic adhesive, yields superior oxidation resistance, and has a surface color that is black (refer to Patent Document 5).

Preferably, after forming the cobalt plated layer or the cobalt-nickel alloy plated layer, rust-proof treatment as represented with coating with chrome oxide alone or coating with composite of chrome oxide and zinc and/or zinc oxide is performed.

Subsequently, pursuant to advances in the development of electronic equipment, the miniaturization and high integration of semiconductor devices advanced even further, and the treatments that are performed during the manufacture of these printed circuits are based on even higher temperatures. In addition, due to the generation of heat during the use of devices after commercialization, deterioration in the bonding strength between the copper foil and the resin base material once again surfaced as a problem.

In light of the above, in the treatment method of a copper foil for a printed circuit of Patent Document 5 which performs roughening treatment to the surface of a copper foil by way of copper-cobalt-nickel alloy plating, and thereafter forming a cobalt plated layer or a cobalt-nickel alloy plated layer, the present applicant devised an invention for improving the thermal peeling resistance.

This is a treatment method of a copper foil for a printed circuit of forming a cobalt-nickel alloy plated layer after performing roughening treatment to the surface of a copper foil by way of copper-cobalt-nickel alloy plating, and additionally forming a zinc-nickel alloy plated layer. This is an extremely effective invention and is one of the primary products of present-day copper foil circuit materials.

A copper foil circuit is becoming even thinner as described above, and the process of soft etching using an etching solution containing sulfuric acid and hydrogen peroxide on the copper circuit surface after once forming the circuit on the substrate is being performed. During this process, a problem of the etching solution penetrating the edge part of the bonded part of a resin substrate of polyimide or the like and copper foil occurred.

To put it differently, a part of the treatment surface of the copper foil is being corroded. This kind of corrosion will deteriorate the bonding strength between the copper foil and the resin in a fine circuit, and is a major problem. Thus, a solution to this problem is also required.

In the treatment of a copper foil for a printed circuit of forming a cobalt-nickel alloy plated layer after performing roughening treatment to the surface of a copper foil by way of copper-cobalt-nickel alloy plating, and additionally forming a zinc-nickel alloy plated layer, the present inventors made numerous proposals, and there were several major progresses in the characteristics of a copper foil for a printed circuit. The initial technology of roughening treatment based on copper-cobalt-nickel alloy plating is disclosed in Patent Document 7 and Patent Document 8.

Nevertheless, since the shape of the roughening particles is dendritic in the most basic roughening treatment based on the copper-cobalt-nickel alloy plating described above, there was a problem in that the upper part of such dendritic particles would shed from the copper foil surface, and thereby cause a phenomenon that is generally known as powder falling. Moreover, if plating treatment is further performed to this kind of roughened surface, uneven treatment would sometimes arise. This became a cause of problems such as etching residues pursuant to the refining of the circuit pattern.

[Patent Document 1] Japanese Laid-Open Patent Publication No. S52-145769
[Patent Document 2] Japanese Patent Publication No. S63-2158
[Patent Document 3] Japanese Patent Application No. H1-112227
[Patent Document 4] Japanese Patent Application No. H1-112226
[Patent Document 5] Japanese Patent Publication No. H6-54831
[Patent Document 6] Japanese Patent Publication No. 2849059
[Patent Document 7] Japanese Laid-Open Patent Publication No. H4-96395
[Patent Document 8] Japanese Laid-Open Patent Publication No. H10-18075

SUMMARY OF THE INVENTION

An object of this invention is to inhibit roughening particles formed dendritically in the most basic roughening treatment based on copper-cobalt-nickel alloy plating from shedding from the copper foil surface, and thereby inhibit the phenomenon known as powder falling and uneven treatment. With the development of electronic equipment, in semiconductor devices, the size has been further reduced, and the higher integration has been advanced. There are even more severe demands for the treatment in a production process of printed circuits. This invention provides technology for meeting such demands.

The present invention provides:
1) A copper foil for a printed circuit with an electrodeposited ternary-alloy layer composed of copper, cobalt and nickel formed on a surface of the copper foil, wherein the electrodeposited layer comprises dendritic particles grown on the copper foil surface, and the entire surface of the copper foil is covered with particles having an area as seen from above the copper foil surface of 0.1 to 0.5 $\mu m^2$ at a density of 1000 particles/10000 $\mu m^2$ or less, particles exceeding 0.5 $\mu m^2$ at a density of 100 particles/10000 $\mu m^2$ or less, and particles less than 0.1 $\mu m^2$ as the remainder;
2) The copper foil for a printed circuit according to 1) above, wherein the number of particles having an area as seen from above the copper foil surface of 0.1 to 0.5 $\mu m^2$ is 300 particles/10000 $\mu m^2$ or less;
3) The copper foil for a printed circuit according to 1) or 2) above, wherein the number of dendritic particles having an area as seen from above the copper foil surface of 0.1 to 0.5 $\mu m^2$ is 100 particles/10000 $\mu m^2$ or less, and the number of dendritic particles exceeding 0.5 $\mu m^2$ is 30 particles/10000 $\mu m^2$ or less;
4) The copper foil for a printed circuit according to any one of 1) to 3) above, wherein the copper foil for a printed circuit comprises a roughened layer based on copper-cobalt-nickel alloy plating, in which the deposited masses are respectively 15 to 40 mg/dm$^2$ of copper, 100 to 3000 $\mu g/dm^2$ of cobalt and 100 to 1000 $\mu g/dm^2$ of nickel, on the copper foil surface; and
5) A copper clad laminate obtained by bonding the copper foil for a printed circuit according to any one of 1) to 4) above to a resin substrate.

The present invention can provide a copper foil for a printed circuit in which a cobalt-nickel alloy plated layer is formed on the roughened layer based on the copper-cobalt-nickel alloy plating, and a zinc-nickel alloy plated layer is additionally formed on the foregoing cobalt-nickel alloy plated layer.

With the foregoing cobalt-nickel alloy plated layer, the deposited mass of cobalt can be set to 200 to 3000 $\mu g/dm^2$, and the ratio of cobalt can be set to 60 to 66 mass percent. With the foregoing zinc-nickel alloy plated layer, it is possible to form a zinc-nickel alloy plated layer in which the total amount thereof is within a range of 150 to 500 $\mu g/dm^2$, the nickel content is within a range of 50 $\mu g/dm^2$ or more, and the nickel ratio is within the range of 0.16 to 0.40.

Moreover, a rust-proof layer can be formed on the zinc-nickel alloy plated layer or the cobalt-nickel alloy plated layer.

The rust-proof treatment can be coating with chromium oxide alone or coating with composite of chromium oxide and zinc and/or zinc oxide. In addition, a silane coupling layer can be formed on the layer coated with composite.

A copper clad laminate can be produced by bonding the foregoing copper foil for a printed circuit to a resin substrate based on thermocompression without using an adhesive.

The present invention yields effects of being able to inhibit roughening particles formed dendritically in the roughening treatment based on copper-cobalt-nickel alloy plating from shedding from the copper foil surface, and thereby inhibit the phenomenon known as powder falling and uneven treatment.

With the development of electronic equipment, in semiconductor devices, the size has been further reduced, and the higher integration has been advanced. There are even more severe demands for the treatment in a production process of printed circuits. This invention provides technology for meeting such demands.

DETAILED DESCRIPTION OF THE INVENTION

Figure 1:
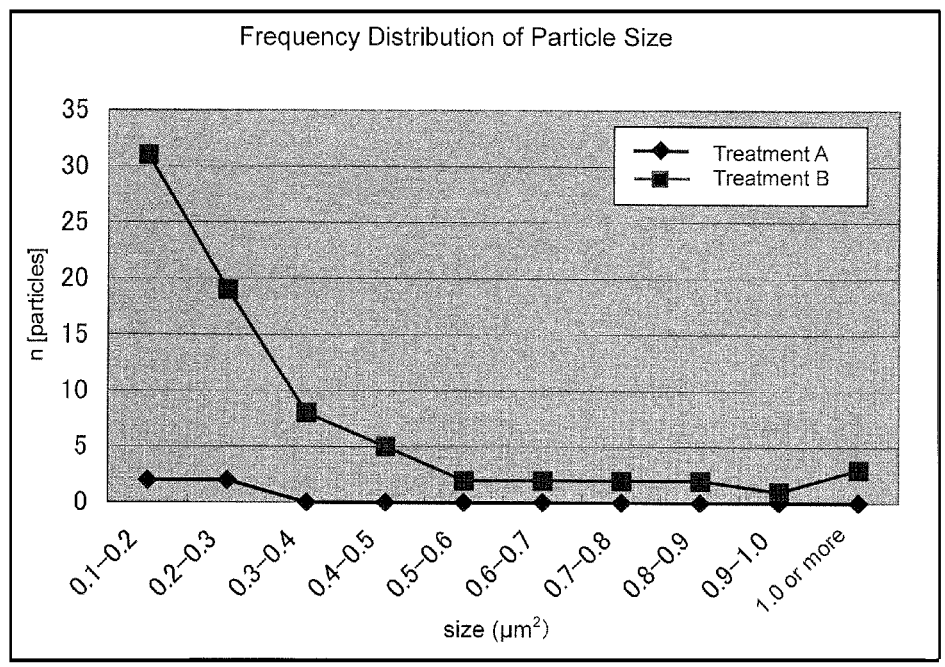
FIG. 1 is a diagram showing the frequency distribution of the particle size.

As the copper foil used in the present invention, both an electrolytic copper foil and a rolled copper foil can be used. Normally, in order to increase the peel strength of the copper foil after its lamination, the surface of a copper foil to be bonded to the resin base material, namely the roughened surface, is subject to roughening treatment, in which electrodeposition is performed after the surface of copper foil is degreased so as to achieve a "nub" shape. The electrolytic copper foil possesses asperities at the time of manufacture, and the convex parts of the electrolytic copper foil are reinforced and the asperities are enlarged further by way of the roughening treatment.

In the present invention, the roughening treatment is performed by way of copper-cobalt-nickel alloy plating. As the preprocessing before the roughening treatment, ordinary plating of copper is sometimes performed, and as the finishing process after the roughening treatment, ordinary plating of copper is sometimes performed in order to prevent the falling of the electrodeposits. The present invention covers all of the above.

The treatment may differ slightly with the rolled copper foil and the electrolytic copper foil. In the present invention, the foregoing preprocessing and finishing process as well as other publicly known processes related to the roughening of the copper foil are hereinafter collectively referred to as the "roughening treatment" as appropriate.

The copper-cobalt-nickel alloy plating as the roughening treatment in the present invention is to form a ternary-alloy layer, in which the deposited masses are respectively 15 to 40 mg/dm$^2$ of copper, 100 to 3000 μg/dm$^2$ of cobalt and 100 to 500 μg/dm$^2$ of nickel, by way of electrolytic plating.

If the deposited mass of Co is less than 100 μg/dm$^2$, the thermal resistance will become inferior, and the etching properties will also become inferior. If the deposited mass of Co exceeds 3000 μg/dm$^2$, this is not preferable in cases where it is necessary to give consideration to the influence of magnetic properties, etching stain will occur, and the acid resistance and chemical resistance may deteriorate.

If the deposited mass of Ni is less than 100 μg/dm$^2$, the thermal resistance will become inferior. Meanwhile, if the deposited mass of Ni exceeds 500 μg/dm$^2$, the etching properties will deteriorate. Specifically, etching residue will remain and, although this is not at a level where etching cannot be performed, it will be difficult to obtain a fine pattern. The preferable deposited mass of Co is 2000 to 3000 μg/dm$^2$, and the preferable deposited mass of nickel is 200 to 400 μg/dm$^2$.

Accordingly, it can be said that the deposited masses of the copper-cobalt-nickel alloy plating are preferably 15 to 40 mg/dm$^2$ of copper, 100 to 3000 μg/dm$^2$ of cobalt, and 100 to 500 μg/dm$^2$ of nickel. Each of the deposited mass of the ternary-alloy layer is merely a preferred condition, and does not deny the range exceeding the foregoing amounts.

Here, an etching stain refers to the case where Co remains without dissolving when etching is performed using copper chloride, and an etching residue refers to the case where Ni remains without dissolving when alkali etching is performed using ammonium chloride.

Generally speaking, upon forming a circuit, an alkali etching solution and a copper chloride etching solution as explained in the following Examples are used. The etching solutions and etching conditions have versatility and are not limited to the following conditions, and it should be understood that the etching solutions and etching conditions may be arbitrarily selected.

The general plating bath and plating conditions for forming the foregoing ternary-system copper-cobalt-nickel alloy plating are as follows.
(Copper-Cobalt-Nickel Alloy Plating)
Cu: 10 to 20 g/liter
Co: 1 to 10 g/liter
Ni: 1 to 10 g/liter
pH: 1 to 4
Temperature: 30 to 40° C.
Current Density $D_k$: 20 to 30 A/dm$^2$
Time: 1 to 5 seconds As described above, the present invention is a copper foil for a printed circuit with an electrodeposited ternary-alloy layer composed of copper, cobalt and nickel formed on a surface of the copper foil, wherein the electrodeposited layer comprises dendritic particles grown on the copper foil surface, and the entire surface of the copper foil is covered with particles having an area as seen from above the copper foil surface of 0.1 to 0.5 μm$^2$ at a density of 1000 particles/10000 μm$^2$ or less, particles exceeding 0.5 μm$^2$ at a density of 100 particles/10000 μm$^2$ or less, and particles less than 0.1 μm$^2$ as the remainder. This can be achieved by arbitrarily selecting and adjusting the foregoing plating conditions according to the plating thickness. In particular, it is effective to lower the current density and perform plating at a relatively lower temperature. However, if the current density $D_k$ is less than 20 A/dm$^2$, the formation of the roughening particles becomes difficult. Moreover, if the current density $D_k$ exceeds 30 A/dm$^2$, the dendritic particles will become coarse, and adjustment needs to be made in consideration of this point.

Upon observing the mode of the roughening treatment particles, the existence of a main stem growing from the copper foil surface can be acknowledged. As this main stem extends from the copper foil surface, it branches and spreads dendritically. The dendritically-expanded roughening particles have an effect of yielding strong adhesive force based on the anchor effect upon becoming attached with resin. Contrarily, since the strength of the dendritically-expanded portion becomes weak, they shed during the various treatment processes and cause the powder falling phenomenon.

This powder falling causes the problems of uneven plating, and even plating failure in the subsequent plating treatment. Accordingly, the shape of the dendritic particles that grow from the copper foil surface is important.

Conventionally, the roughening particles have never been examined based on the foregoing perspective, and the conventional technologies merely promoted the development of the dendritic particles, and included the foregoing problem. This problem can be resolved by the present invention, and this is even more effective for the formation of a fine pattern printed circuit.

Preferably, with the foregoing roughening particles, the number of particles having an area as seen from above the copper foil surface of 0.1 to 0.5 $\mu m^2$ is 300 particles/10000 $\mu m^2$ or less, and with the dendritic particles, the number of particles having an area as seen from above the copper foil surface of 0.1 to 0.5 $\mu m^2$ is 100 particles/10000 $\mu m^2$ or less, and the number of particles exceeding 0.5 $\mu m^2$ is 30 particles/10000 $\mu m^2$ or less.

As described above, to considerably develop the dendritic particles is not advisable since it will lead to the increase in the amount of powder falling. In this respect, the height of the dendritic particles from the copper foil surface is preferably set from 0.1 $\mu m$ to 1.0 $\mu m$, and more preferably set from 0.2 $\mu m$ to 0.6 $\mu m$. Moreover, with respect to the dendritic particles, the number of those with a lateral branch with a length that is longer than the diameter of the main stem of the dendritic particles that grew from the copper foil surface is preferably 100 particles/10000 $\mu m^2$ or less, and more preferably 30 particles/10000 $\mu m^2$ or less.

Accordingly, the number of abnormally grown particles can be reduced, the particle size becomes small and of a similar size, and the particles will cover the entire surface. Thus, the etching properties can be improved, etching residue and unevenness can be prevented, and the sharp formation of a circuit is enabled. Moreover, by applying resin, an effect is yielded in that the generation of bubbles is prevented and uniform application is enabled.

With the present invention, after the roughening treatment, a cobalt-nickel alloy plated layer can be formed on the roughened surface. With this cobalt-nickel alloy plated layer, the deposited mass of cobalt is 200 to 3000 $\mu g/dm^2$, and the cobalt ratio is desirably 60 to 66 mass percent. This treatment, in a broad sense, can be thought as one type of rust-proof treatment.

The cobalt-nickel alloy plated layer needs to be formed at a level where the adhesive strength of the copper foil and the substrate will not substantially deteriorate. If the deposited mass of cobalt is less than 200 $\mu g/dm^2$, the thermal peeling strength will deteriorate, and the oxidation resistance and chemical resistance will become inferior, and the treated surface will become a reddish color, and this is undesirable. If the deposited mass of cobalt exceeds 3000 $\mu g/dm^2$, this is not preferable in cases where it is necessary to give consideration to the influence of magnetic properties, etching stain will occur, and the acid resistance and chemical resistance may deteriorate. Thus, the preferable deposited mass of cobalt is 500 to 3000 $\mu g/dm^2$.

Moreover, if the deposited mass of cobalt is large, there are cases where it may cause the penetration of soft etching. In light of the above, the cobalt ratio is desirably 60 to 66 mass percent.

As described later, the primary and direct cause of the penetration caused by the soft etching is the heat and rust proof layer configured from the zinc-nickel alloy plated layer. However, since cobalt also causes the penetration during the soft etching in certain cases, the foregoing adjustment would be a more desirable condition.

Meanwhile, if the deposited mass of nickel is small, the thermal peeling strength will deteriorate, and the oxidation resistance and chemical resistance will also deteriorate. If the deposited mass of nickel is excessive, the alkali etching properties will become inferior, and it is desirable to be decided in the balance with the foregoing cobalt content.

Conditions of the cobalt-nickel alloy plating are as follows. Nevertheless, these conditions are merely preferred conditions, and other known cobalt-nickel alloy plating may also be used. It should be understood that the cobalt-nickel alloy plating is a preferred additional condition in the present invention.

(Cobalt-Nickel Alloy Plating)
Co: 1 to 20 g/liter
Ni: 1 to 20 g/liter
pH: 1.5 to 3.5
Temperature: 30 to 80° C.
Current Density $D_k$: 1.0 to 20.0 $A/dm^2$
Time: 0.5 to 4 seconds With the present invention, a zinc-nickel alloy plated layer can be additionally formed on the cobalt-nickel alloy plating. The total amount of the zinc-nickel alloy plated layer is set to 150 to 500 $\mu g/dm^2$, and the nickel ratio is set to 16 to 40 mass percent. This plays a role as the heat and rust proof layer. These conditions are also merely preferred conditions, and other known zinc-nickel alloy plating may also be used. It should be understood that the zinc-nickel alloy plating is a preferred additional condition in the present invention.

The treatments that are performed during the manufacture of these printed circuits are based on even higher temperatures, and heat is generated during the use of devices after commercialization. For example, with a so-called bilayer material in which copper foil is bonded to resin by way of thermocompression, it is subject to heat of 300° C. or higher during the bonding process. Even under these circumstances, it is necessary to prevent the deterioration in the bonding strength between the copper foil and the resin base material, and this zinc-nickel alloy plating is effective therefor.

Moreover, with conventional technology, a fine circuit comprising a zinc-nickel alloy plated layer in the bilayer material obtained by bonding copper foil to resin by way of thermocompression was subject to discoloration due to the penetration at the circuit edge part during the soft etching. Nickel is effective in inhibiting the penetration of the etchant (etching aqueous solution containing 10 wt % of $H_2SO_4$ and 2 wt % of $H_2O_2$) that is used for the soft etching.

As described above, if the total amount of the zinc-nickel alloy plated layer is 150 to 500 $\mu g/dm^2$, the lower limit of the nickel ratio in the alloy layer is 0.16, the upper limit thereof is 0.40, and the nickel content is 50 $\mu g/dm^2$ or more, it is possible to comprise the role of the heat and rust proof layer, and yield the effects of inhibiting the penetration of the etchant that is used for the soft etching, and preventing the weakening of the bonding strength of the circuit caused by corrosion.

Note that, if the total amount of the zinc-nickel alloy plated layer is less than 150 $\mu g/dm^2$, the resistance to heat and rust will deteriorate and it will become difficult to fulfill the role as the heat and rust proof layer. Meanwhile, if the total amount exceeds 500 $\mu g/dm^2$, the hydrochloric acid resistance tends to deteriorate.

Moreover, if the lower limit of the nickel ratio in the alloy layer is less than 0.16, this is not preferable since the amount of penetration during the soft etching will exceed 9 $\mu m$. The upper limit of the nickel ratio at 0.40 is the technical threshold limit in forming the zinc-nickel alloy plated layer.

Examples of the conditions of the zinc-nickel alloy plating are as follows.

(Zinc-Nickel Alloy Plating)
Zn: 0 to 30 g/liter
Ni: 0 to 25 g/liter
pH: 3 to 4

Temperature: 40 to 50° C.
Current Density $D_k$: 0.5 to 5 A/dm$^2$
Time: 1 to 3 seconds As described above, in the present invention, the copper-cobalt-nickel alloy plated layer as the roughening treatment, and then the cobalt-nickel alloy plated layer and the zinc-nickel alloy plated layer can be sequentially formed thereon as needed. It is also possible to adjust the total deposited mass of cobalt and the total deposited mass nickel in the foregoing layers. Preferably, the total deposited mass of cobalt is 300 to 5000 μg/dm$^2$, and the total deposited mass nickel is 260 to 1200 μg/dm$^2$.

If the total deposited mass of cobalt is less than 300 μg/dm$^2$, the thermal resistance and chemical resistance will deteriorate. If the total deposited mass of cobalt exceeds 5000 μg/dm$^2$, an etching stain may occur. Moreover, if the total deposited mass of nickel is less than 260 μg/dm$^2$, the thermal resistance and chemical resistance will deteriorate. If the total deposited mass of nickel exceeds 1200 μg/dm$^2$, an etching residue will occur.

Preferably, the total deposited mass of cobalt is 2500 to 5000 μg/dm$^2$, and the total deposited mass of nickel is 580 to 1200 μg/dm$^2$, and more preferably 600 to 1000 μg/dm$^2$. However, so as long as the foregoing conditions are satisfied, there is no need to be restricted to the conditions provided in this paragraph.

Subsequently, rust-proof treatment is performed as needed. The preferred rust-proof treatment in the present invention is coating with chrome oxide alone or coating with composite of chrome oxide and zinc/zinc oxide. Coating with composite of chrome oxide and zinc/zinc oxide is the treatment of coating a rust-proof layer of a zinc/chrome-based composite formed from zinc or zinc oxide and chrome oxide by performing electrolytic plating using a plating bath containing zinc salt or zinc oxide and chromate.

An representative example of the plating bath is a mixed aqueous solution containing at least one type of bichromate such as $K_2Cr_2O_7$ and $Na_2Cr_2O_7$, $CrO_3$ or the like, and at least one type of water-soluble zinc salt such as ZnO and $ZnSO_4.7H_2O$, and alkali hydroxide. The representative plating bath composition and electrolytic conditions are as follows.

(Chrome Rust-Proof Treatment)
$K_2Cr_2O_7$ ($Na_2Cr_2O_7$ or $CrO_3$): 2 to 10 g/liter
NaOH or KOH: 10 to 50 g/liter
ZnO or $ZnSO_4.7H_2O$: 0.05 to 10 g/liter
pH: 3 to 13
Bath temperature: 20 to 80° C.
Current density $D_k$: 0.05 to 5 A/dm$^2$
Time: 5 to 30 seconds
Anode: Pt—Ti plate, stainless steel plate, etc.

With the chrome oxide, a chrome content of 15 μg/dm$^2$ or more is required, and a zinc content of 30 μg/dm$^2$ or more is required as the coating weight.

The obtained copper foil possesses superior thermal peeling strength, oxidation resistance and hydrochloric acid resistance. Moreover, the printed circuit having a circuit width of 150 μm pitch or less can be etched using a $CuCl_2$ etching solution, and alkali etching is also possible. Moreover, it is possible to inhibit the penetration to the circuit edge part during the soft etching process.

As the soft etching solution, an aqueous solution containing 10 wt % of $H_2SO_4$ and 2 wt % of $H_2O_2$ may be used. The treatment time and temperature can be arbitrarily adjusted.

As the alkali etching solution, for example, a solution of $NH_4OH$: 6 moles/liter, $NH_4Cl$: 5 moles/liter, $CuCl_2$: 2 moles/liter (temperature: 50° C.) and the like can be used.

The copper foil obtained from the entire process described above has the same black color as in the case of Cu—Ni treatment. The black color is significant, since the positioning accuracy and thermal absorption are sufficient. For example, an IC, resistor, condenser and other components are mounted on a printed circuit substrate, whether it is a rigid substrate or a flexible substrate, based on an automated process, and the chip mount is performed while reading the circuit with a sensor during the foregoing process. Here, positioning is sometimes performed at the copper foil treatment surface via a kapton film or the like. Moreover, the same applies to the positioning upon forming a through-hole.

The blacker the treatment surface, the positioning accuracy will improve since the absorption of light is favorable. In addition, upon preparing a substrate, and the copper foil and film are often bonded by way of curing while applying heat thereto. Here, if long waves of far-infrared rays or infrared rays are used for the heating process, the heating efficiency will improve if the color of the treatment surface is blacker.

Finally, as needed, silane treatment of applying a silane coupling agent on at least the roughened surface of the rust-proof layer is performed primarily to improve the adhesiveness between the copper foil and the resin substrate.

As the silane coupling agent to be used in the foregoing silane treatment, olefinic silane, epoxy-system silane, acrylic silane, amino silane, and mercapto silane may be considered, and these may be suitably selected and used.

As the application method, spraying a silane coupling agent solution, application with a coater, dip coating, pouring coating or the like may be used. For example, Japanese Patent Publication No. S60-15654 describes that the adhesiveness between the copper foil and resin substrate improves by performing chromate treatment to the roughened surface side of the copper foil, and thereafter performing silane coupling agent treatment. Please refer to the foregoing document for details. Subsequently, as needed, annealing treatment is sometimes performed for the purpose of improving the ductility of the copper foil.

EXAMPLES

The Examples and Comparative Examples of the present invention are now explained. These Examples are merely illustrative, and the present invention shall in no way be limited thereby. In other words, various modifications and other embodiments based on the technical spirit claimed in the claims shall be included in the present invention as a matter of course.

Example

Roughening treatment was performed to a rolled copper foil by way of copper-cobalt-nickel alloy plating within the range of the following conditions. After adhering 17 mg/dm$^2$ of copper, 2000 μg/dm$^2$ of cobalt and 500 μg/dm$^2$ of nickel, the copper foil was water washed, and a cobalt-nickel alloy plated layer was formed thereon. Here, the deposited mass of cobalt was 800 to 1400 μg/dm$^2$, and the deposited mass of nickel was 400 to 600 μg/dm$^2$.

The used bath composition and plating conditions were as follows.

[Bath Composition and Plating Conditions]
(A) Roughening Treatment (Cu—Co—Ni Alloy Plating)
Cu: 15.5 g/liter
Co: 6 g/liter
Ni: 11 g/liter
pH: 2.5

Temperature: 30° C.
Current Density $D_k$: 20 A/dm$^2$
Time: 2 seconds
Deposited mass of copper: 17 mg/dm$^2$
Deposited mass of cobalt: 2000 μg/dm$^2$
Deposited mass of nickel: 500 μg/dm$^2$ Comparative Example The used bath composition and plating conditions in the Comparative Example were as follows.
[Bath Composition and Plating Conditions]
(B) Roughening Treatment (Cu—Co—Ni Alloy Plating)
Cu: 15.5 g/liter
Co: 8 g/liter
Ni: 8 g/liter
pH: 2.5
Temperature: 40° C.
Current Density $D_k$: 45 A/dm$^2$
Time: 2 seconds
Deposited mass of copper: 25 mg/dm$^2$
Deposited mass of cobalt: 2500 μg/dm$^2$
Deposited mass of nickel: 500 μg/dm$^2$ The roughening treatment (Cu—Co—Ni alloy plating) on the copper foil formed based on the foregoing Example and the Comparative Example was observed at 10 locations with an electron microscope with a 30000 times field (4 μm×3 μm), the area of the outer edge of the roughening particles was measured, and the frequency distribution thereof was created. The results are shown in Table 1 and FIG. 1.

TABLE 1

| | Example (Treatment A) | Comparative Example (Treatment B) |
|---|---|---|
| Less than 0.1 μm$^2$ | Remaining | Remaining |
| 0.1 to 0.2 | 2 | 31 |
| 0.2 to 0.3 | 2 | 19 |
| 0.3 to 0.4 | 0 | 8 |
| 0.4 to 0.5 | 0 | 5 |
| 0.5 to 0.6 | 0 | 2 |
| 0.6 to 0.7 | 0 | 2 |
| 0.7 to 0.8 | 0 | 2 |
| 0.8 to 0.9 | 0 | 2 |
| 0.9 to 1.0 | 0 | 1 |
| 1.0 μm$^2$ or more | 0 | 3 |

Shown in Table 1 is the frequency in 4 μm×3 μm×10=120 μm$^2$, and the number of particles of 0.1 to 0.5 μm$^2$ was 63 particles in treatment B of the Comparative Example, and 4 particles in treatment A of the Example.

Moreover, the number of particles exceeding 0.5 μm$^2$ was 12 particles in treatment B of the Comparative Example, and 0 particles in treatment A of the Example. Even from the results of other fields of view, in the case of treatment A, the roughening particles were of less than 0.5 μm$^2$.

When summarizing these results and converting them into 100 μm square (10000 μm$^2$), the number of particles of 0.1 to 0.5 μm$^2$ in treatment B of the Comparative Example was 6000 particles, and the number of particles exceeding 0.5 μm$^2$ was approximately 1000 particles. Meanwhile, in treatment A of the Example, the number of particles of 0.1 to 0.5 μm$^2$ was 1000 particles even in cases where such number was high, and the number of particles exceeding 0.5 μm$^2$ was approximately 100 particles. It is evident that frequency of large particles exceeding 0.5 μm$^2$ is particularly low.

Under more preferable conditions, the number of particles of 0.1 to 0.5 μm$^2$ can be reduced to 300 particles, and the number of particles exceeding 0.5 μm$^2$ can be reduced to approximately 30 particles.

In addition, upon observing the mode of the roughening particles, in treatment B of the Comparative Example, as the main stem grows more on the copper foil surface extends from the copper foil surface, it branches and spreads dendritically.

In the foregoing case, the roughening particles have an effect of yielding strong adhesive force based on the anchor effect when the copper foil surface having these particles is bonded to resin, but there was a problem in that the dendritically-expanded portion would shed during the treatment process.

Figure 2:
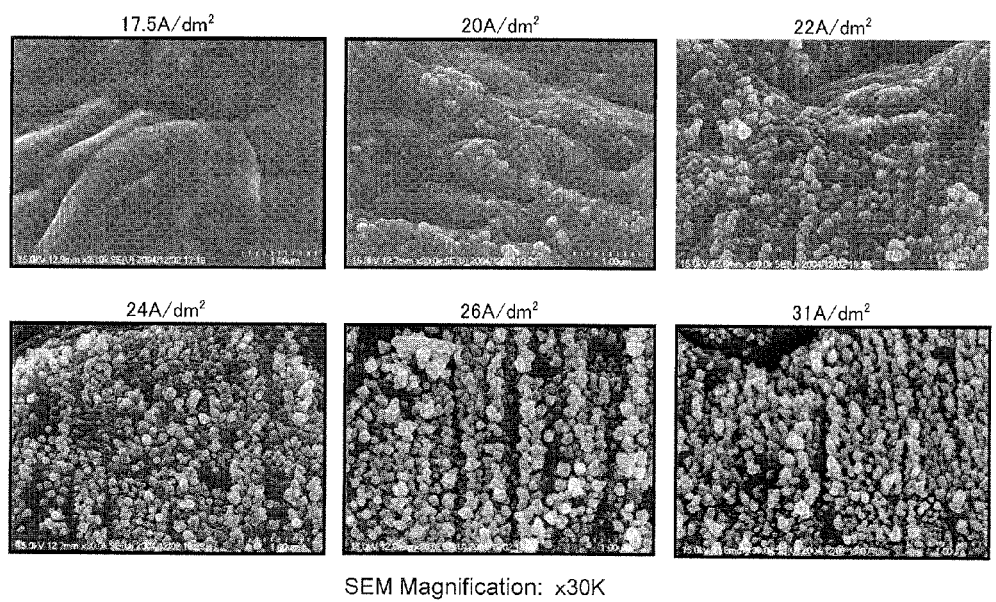
FIG. 2 is a photomicrograph showing the current density and plating condition of the Example and the Comparative Example.

The photomicrograph of the current density and the Cu—Co—Ni alloy plating is shown in FIG. 2. Based on FIG. 2, it can be understood that, if the current density is 20 A/dm$^2$, the growth of the roughening particles is insufficient. Meanwhile, if the current density exceeds 30 A/dm$^2$, it can be understood that the growth of the particles becomes expanded, or becomes uneven. Thus, it can be understood that the preferable range of the current density $D_k$ is 20 to 30 A/dm$^2$.

Figure 3:
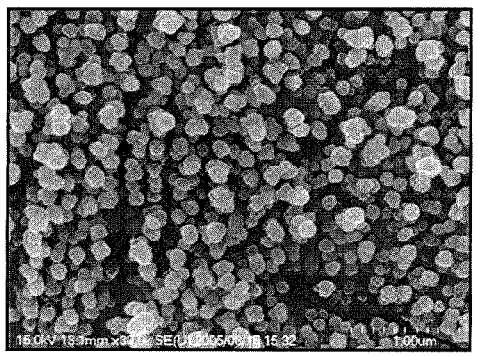
FIG. 3 is a photomicrograph of the Cu—Co—Ni alloy plating of the present invention with a uniform and fine crystal grain size and which is free of powder falling, and a photomicrograph of the Cu—Co—Ni alloy plating of the Comparative Example of a petal shape.
Figure 3:
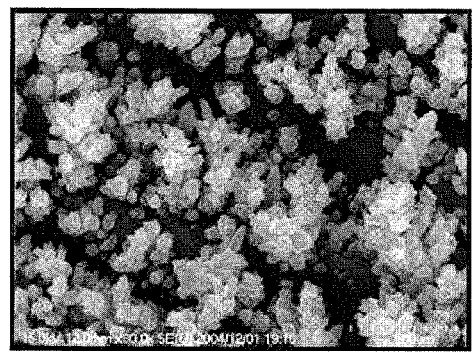

Moreover, a representative photomicrograph of the Cu—Co—Ni alloy plating of the present invention which is free of powder falling, and a photomicrograph of the Cu—Co—Ni alloy plating of the Comparative Example that was subject to powder falling are shown in FIG. 3.

The left side of FIG. 3 shows the representative example of the present invention, and it can be understood that Cu—Co—Ni alloy plating with uniform and fine particles is being formed.

Meanwhile, the right side of FIG. 3 shows the Comparative Example, and the dendritic particles have developed into a petal shape. In the foregoing case, there is a problem in that the powder falling increases.

INDUSTRIAL APPLICABILITY

Since present invention yields superior effects of being able to inhibit roughening particles formed dendritically in the roughening treatment based on copper-cobalt-nickel alloy plating from shedding from the copper foil surface, and thereby inhibit the phenomenon known as powder falling and uneven treatment, it is effective as a printed circuit material for use in electronic equipment in which the miniaturization and higher integration of semiconductor devices are being advanced.

The invention claimed is:

1. A copper foil for a printed circuit with an electrodeposited ternary-alloy layer composed of copper, cobalt and nickel formed on a surface of the copper foil to be bonded to a resin substrate, wherein the electrodeposited layer has a surface comprising dendritic particles grown on and covering the copper foil surface, each of the dendritic particles having an outer edge defining an area, and wherein the dendritic particles of the electroplated layer consist of particles having outer edges each defining an area of 0.1 to 0.5 μm$^2$ dispersed on the surface of the electrodeposited layer at a density of 1000 particles/10000 μm$^2$ or less, particles having outer edges each defining an area exceeding 0.5 μm$^2$ dispersed on the surface of the electrodeposited layer at a density of 100 particles/10000 μm$^2$ or less, and a remainder of particles having outer edges each defining an area of less than 0.1 μm$^2$ on the surface of the electrodeposited layer.

2. The copper foil for a printed circuit according to claim 1, wherein the density of dendritic particles having outer edges each defining an area of 0.1 to 0.5 μm$^2$ is 300 particles/10000 μm$^2$ or less.

3. The copper foil for a printed circuit according to claim 2, wherein the density of dendritic particles having outer edges each defining an area of 0.1 to 0.5 $\mu m^2$ is 100 particles/10000 $\mu m^2$ or less, and the density of dendritic particles having outer edges each defining an area exceeding 0.5 $\mu m^2$ is 30 particles/10000 $\mu m^2$ or less.

4. The copper foil for a printed circuit according to claim 3, wherein the copper foil for a printed circuit comprises a roughened layer based on copper-cobalt-nickel alloy plating, in which the deposited masses are respectively 15 to 40 mg/$dm^2$ of copper, 100 to 3000 $\mu g/dm^2$ of cobalt and 100 to 1000 $\mu g/dm^2$ of nickel, on the copper foil surface.

5. A copper clad laminate comprising the copper foil for a printed circuit according to claim 4 bonded to a resin substrate with the electrodeposited layer being located between the copper foil and resin substrate.

6. The copper foil for a printed circuit according to claim 1, wherein the density of dendritic particles having outer edges each defining an area of 0.1 to 0.5 $\mu m^2$ is 100 particles/10000 $\mu m^2$ or less, and the density of dendritic particles having outer edges each defining an area exceeding 0.5 $\mu m^2$ is 30 particles/10000 $\mu m^2$ or less.

7. The copper foil for a printed circuit according to claim 1, wherein the copper foil for a printed circuit comprises a roughened layer based on copper-cobalt-nickel alloy plating, in which the deposited masses are respectively 15 to 40 mg/$dm^2$ of copper, 100 to 3000 m/$dm^2$ of cobalt and 100 to 1000 $\mu g/dm^2$ of nickel, on the copper foil surface.

8. A copper clad laminate, comprising:
a copper foil for a printed circuit;
an electrodeposited ternary-alloy layer composed of copper, cobalt and nickel and consisting of dendritic particles grown on and covering a surface of the copper foil, each of the dendritic particles on a surface of the having an outer edge defining an area of a size that is greater than 0.5 $\mu m^2$, 0.1 to 0.5 $\mu m^2$, or less than 0.1 $\mu m^2$, the dendritic particles having the size of 0.1 to 0.5 $\mu m^2$ dispersed on the electrodeposited layer existing at a density of 1000 particles/10000 $\mu m^2$ or less, the dendritic particles having the size exceeding 0.5 $\mu m^2$ existing at a density of 100 particles/10000 $\mu m^2$ or less, and a remainder of the dendritic particles of being of the size of less than 0.1 $\mu m^2$; and
a resin substrate bonded to the copper foil with the electrodeposited ternary-alloy layer being located between the copper foil and resin substrate.

9. A copper foil according to claim 1, wherein a layer consisting of copper is plated on the electrodeposited ternary-alloy layer and located between the electrodeposited ternary-alloy layer and the resin substrate.

10. A copper foil according to claim 1, wherein a layer consisting of copper-nickel alloy is plated over the electrodeposited ternary-alloy layer and located between the electrodeposited ternary-alloy layer and the resin substrate.

11. A copper foil according to claim 10, wherein a layer consisting of zinc-nickel alloy is plated over the copper-nickel alloy and located between the electrodeposited ternary-alloy layer and the resin substrate.

* * * * *